(12) United States Patent
Wang et al.

(10) Patent No.: US 10,510,728 B2
(45) Date of Patent: Dec. 17, 2019

(54) MAGNETIC COUPLING PACKAGE STRUCTURE FOR MAGNETICALLY COUPLED ISOLATOR WITH DUO LEADFRAMES AND METHOD FOR MANUFACTURING THE SAME

(71) Applicant: LITE-ON SINGAPORE PTE. LTD., Midview (SG)

(72) Inventors: You-Fa Wang, Singapore (SG); Wei-Wen Lai, Kaohsiung (TW); Pu-Han Lin, New Taipei (TW)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 16/041,174

(22) Filed: Jul. 20, 2018

(65) Prior Publication Data
US 2019/0214368 A1    Jul. 11, 2019

(30) Foreign Application Priority Data

Jan. 5, 2018    (CN) .......................... 2018 1 0011014

(51) Int. Cl.
*H01L 25/16*    (2006.01)
*H01L 25/065*    (2006.01)
(Continued)

(52) U.S. Cl.
CPC ......... *H01L 25/0657* (2013.01); *H01F 38/14* (2013.01); *H01L 21/56* (2013.01);
(Continued)

(58) Field of Classification Search
CPC ........... H01L 25/0657; H01L 23/49541; H01L 21/56; H01L 25/16; H01L 23/66; H01L 23/49575; H01L 23/3121; H01L 25/50; H01L 23/49537; H01L 2225/06572; H01L 2225/0651; H01L 2224/48106;
(Continued)

(56) References Cited

U.S. PATENT DOCUMENTS

| 2002/0090755 A1* | 7/2002 | Matsuzaki | ............. | B82Y 25/00 |
| | | | | 438/108 |
| 2008/0061631 A1* | 3/2008 | Fouquet | .................. | H01F 19/08 |
| | | | | 307/109 |

(Continued)

*Primary Examiner* — Cuong B Nguyen
(74) *Attorney, Agent, or Firm* — Li & Cai Intellectual Property (USA) Office

(57) ABSTRACT

The instant disclosure includes a magnetic coupling package structure with duo leadframes for a magnetically coupled isolator and a method for manufacturing the same. The method includes a leadframe providing step, a chip connecting step and a coil alignment step. The leadframe providing step includes providing a first and a second leadframe each including a chip carrying portion, a coil portion, a plurality of pins and floating pins. The chip connecting step includes disposing at least a first chip and at least a second chip onto the corresponding chip carrying portions for electrically connecting the chips to the pins. The coil alignment step includes arranging the first leadframe above or beneath the second leadframe and applying a first and a second magnetic field to the first and the second leadframes respectively for aligning the coil portions, thereby controlling the coupling effect between two coil portions.

10 Claims, 8 Drawing Sheets

(51) Int. Cl.
*H01L 23/495* (2006.01)
*H01L 25/00* (2006.01)
*H01L 23/31* (2006.01)
*H01L 23/66* (2006.01)
*H01F 38/14* (2006.01)
*H01L 21/56* (2006.01)
*H01L 23/00* (2006.01)

(52) U.S. Cl.
CPC ........ *H01L 23/3121* (2013.01); *H01L 23/495* (2013.01); *H01L 23/49537* (2013.01); *H01L 23/49541* (2013.01); *H01L 23/49575* (2013.01); *H01L 23/66* (2013.01); *H01L 25/16* (2013.01); *H01L 25/50* (2013.01); *H01L 24/48* (2013.01); *H01L 2223/6611* (2013.01); *H01L 2223/6661* (2013.01); *H01L 2224/48091* (2013.01); *H01L 2224/48106* (2013.01); *H01L 2224/48245* (2013.01); *H01L 2225/0651* (2013.01); *H01L 2225/06531* (2013.01); *H01L 2225/06572* (2013.01); *H01L 2924/19042* (2013.01)

(58) Field of Classification Search
CPC . H01L 2224/48091; H01L 2224/48245; H01L 24/48; H01L 2223/6611; H01L 2223/6661; H01L 2924/19042; H01L 2225/06531; H01F 38/14
See application file for complete search history.

(56) References Cited

U.S. PATENT DOCUMENTS

2014/0374890 A1* 12/2014 Yamashita ........ H01L 23/49575
257/670
2016/0104663 A1* 4/2016 Wong ................ H01L 23/49503
257/670

* cited by examiner

MAGNETIC COUPLING PACKAGE STRUCTURE FOR MAGNETICALLY COUPLED ISOLATOR WITH DUO LEADFRAMES AND METHOD FOR MANUFACTURING THE SAME

BACKGROUND

1. Technical Field

The instant disclosure relates to a method for manufacturing a magnetic package structure, and in particular, to a magnetic coupling package structure for a magnetically coupled isolator with duo leadframes and a method for manufacturing the same.

2. Description of Related Art

In order to maintain a safe electrical voltage at a user interface and prevent transient from being transmitted from the signal source to low voltage circuits such as computers, a galvanic isolation technique is employed for low or high voltage circuits in some industries. When more than one conductive paths are present between two circuits, a ground circuit is provided, and the plurality of conductive paths may generate current paths that affect the efficiency of the system. Generally, an electrical insulation is provided to break the grounding circuit. In the existing art, three types of isolation techniques are mainly provided: optocouplers formed by LED and photosensors, capacitively-coupled isolators and magnetically coupled isolators.

In the optocouplers, an electronic input signal drives the LED to generate an optical signal, and the optical signal is projected onto the photo-sensor. The photo-sensor converts the optical signal to an electrical signal. The capacitively-coupled isolator employ high voltage capacitors having small capacitance for barring DC electronic signals but allowing the high frequency signal to pass through, thereby achieving the object of galvanic isolation.

The magnetically coupled isolator includes a transmitter, a receiver and a communication unit transmitting signals between the transmitter and the receiver.

The magnetically coupled isolators includes a driving circuit operated under high frequency, a pair of coils having sizes that may range from micrometers (μm) to millimeters (mm), and a high frequency receiver. One of the coils (the first coil) is connected to the output end of the driving circuit, and the other coil (the second coil) is connected to the input end of the receiver. The two coils are galvanically isolated from each other, and hence, there is no electrical connection between the two coils. During the operation, a high frequency signal from the driving circuit is converted into a high frequency magnetic field through the first coil, and is transmitted to the second coil through magnetic coupling. The second coil converts the magnetic signal into a high frequency voltage and inputs the high frequency voltage into a receiving circuit.

In the existing art, the magnetic coupling package structure having a coupling effect between the coils therein generally adopts two types of structural design: (1) coupled coils are directly formed on the chip (a design adopted by the ADI company), or (2) two coils having smaller size are formed on a same plane of a same leadframe for achieving the coupling effect (a design adopted by the PI (Power integration) company). However, the design mentioned above each has disadvantages. Specifically, a method including the step of forming coils directly on the chip is complicated and is subjected to certain technical difficulties, and the product manufactured therefrom is not likely to meet the requirement for super high voltage insulation in the industry. In other words, using such a technique is costly due to the high standard in the semiconductor manufacturing field. One of the disadvantages of the method including the step of forming two coils matched with each other on a plane of a single leadframe is that the product and the coupling efficiency thereof are limited by the size of the coils. Based on the structural design, the method can only be used to produce single channel devices, and is unable to produce multi-channel devices with more than two channels.

In addition, in order to achieve effective coupling effect between two coils, the relative position of the two coils in a horizontal direction and the distance therebetween in the vertical direction have to be precisely designed for aligning the two coils in horizontal direction. Meanwhile, the spacing between the two coils must be controlled as well. Therefore, by adjusting the isolation distance between the two leadframe components, the efficiency of the galvanic isolation between the two coils can be adjusted. In the existing art, there is still a need for developing methods and leadframe components that can be made through simple steps and that are able to conveniently adjust the coupling effect between two coils. Moreover, there is a need to provide a magnetic coupling package structure and a method for manufacturing the same to allow the manufacture of multi-channel devices in simple steps. In other words, there is still room for improvement of the magnetic coupling package structure and the method for manufacturing the same in the existing art.

SUMMARY

The main object of the instant disclosure includes providing a magnetic coupling package structure and a method for manufacturing the same with lower cost. The method provided by the instant disclosure includes using two independent leadframe for respectively forming a first leadframe and a second leadframe. In addition, by applying magnetic fields to each of the two leadframes, the coil portions of the leadframes can be aligned to each other. Furthermore, by adjusting the distance between the two leadframes, the coupling efficiency of the magnetic coupling package structure of the instant disclosure can be adjusted.

In order to achieve the above object, an embodiment of the instant disclosure provides a method for manufacturing a magnetic coupling package structure with duo leadframes for a magnetically coupled isolator including a leadframe providing step, a chip connecting step and a coil aligning step. The leadframe providing step includes providing a first leadframe and a second leadframe, wherein the first leadframe includes a first chip-mounting portion, at least a coil portion, a plurality of first pins and a plurality of floated pins, and the second leadframe includes a second chip-mounting portion, at least a second coil portion, a plurality of second pins and a plurality of second floated pins. The chip connecting step includes respectively disposing at least a first chip and at least a second chip on the first chip-mounting portion and the second chip-mounting portion and establishing electrical connections between the first chip and the first pins, and between the second chip and the second pins. The coil aligning step includes disposing the first leadframe at a position above or under the second leadframe and respectively applying a first magnetic field and a second magnetic field to the first leadframe and the second leadframe for aligning the first coil portion and the second coil portion.

Another embodiment of the instant disclosure provides a magnetic coupling package structure with duo leadframes for a magnetically coupled isolator. The magnetic coupling package structure includes a first leadframe, a second leadframe and an insulating packaging body. The first leadframe includes a first chip-mounting portion, at least a first coil portion, a plurality of first pins and a plurality of first floated pins. The second leadframe includes a second chip-mounting portion, at least a second coil portion, a plurality of second pins and a plurality of second floated pins. The insulating packaging body packages the first chip and the second chip and connects the first leadframe to the second leadframe, wherein a portion of each of the first pins is exposed from the insulating package body, and a portion of each of the second pins is exposed from the insulating package body, the portion of each of the first pins and the portion of the second pins are configured to respectively provide an isolating voltage to the first leadframe and the second leadframe. The first leadframe is disposed at a location above or under the second leadframe, the first leadframe and the second leadframe have a height difference therebetween, the first leadframe and the second leadframe are galvanically isolated from each other, and the first coil portion and the second coil portion match with each other for generating magnetic coupling.

An advantage of the instant disclosure is that the magnetic coupling package structure and the method for manufacturing the same provided by the instant disclosure can achieve the effects of increasing the aligning accuracy of the first coil portion and the second coil portion, and the magnetic coupling effect of the first coil portion and the second coil portion can be controlled by the technical features of "disposing the first leadframe at a position above or under the second leadframe and respectively applying a first magnetic field and a second magnetic field to the first leadframe and the second leadframe for aligning the first coil portion and the second coil portion" or "the first leadframe is disposed at a location above or under the second leadframe, the first leadframe and the second leadframe have a height difference therebetween, the first leadframe and the second leadframe are galvanic isolated from each other, and the first coil portion and the second coil portion match with each other for generating magnetic coupling".

In order to further understand the techniques, means and effects of the instant disclosure, the following detailed descriptions and appended drawings are hereby referred to, such that, and through which, the purposes, features and aspects of the instant disclosure can be thoroughly and concretely appreciated; however, the appended drawings are merely provided for reference and illustration, without any intention to be used for limiting the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DESCRIPTION OF THE EXEMPLARY EMBODIMENTS

Figure 1:
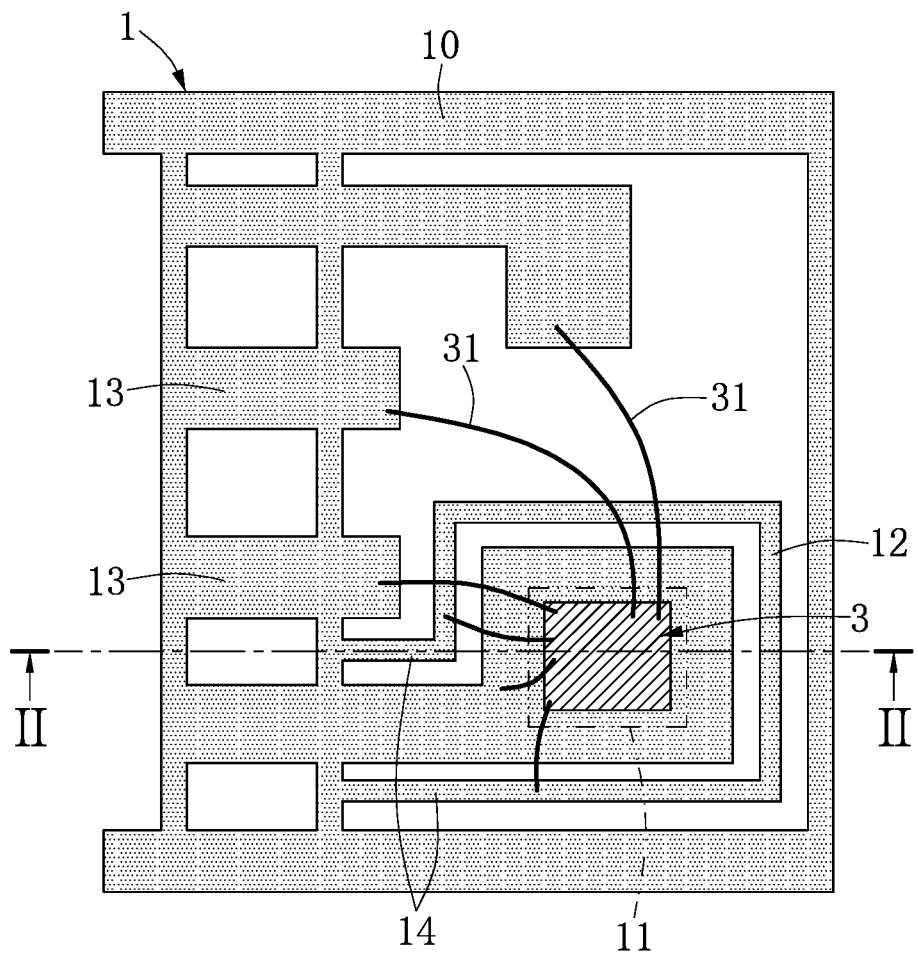
FIG. 1 is a top schematic view of a first leadframe used in an embodiment of the instant disclosure.

Reference will now be made in detail to the exemplary embodiments of the instant disclosure, examples of which are illustrated in the accompanying drawings. Wherever possible, the same reference numbers are used in the drawings and the description to refer to the same or like parts.

Figure 2:
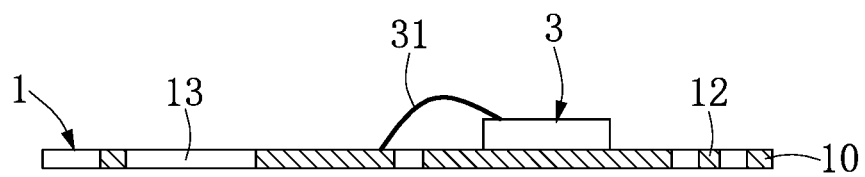
FIG. 2 is a sectional schematic view taken along line II-II of FIG. 1.
Figure 3:
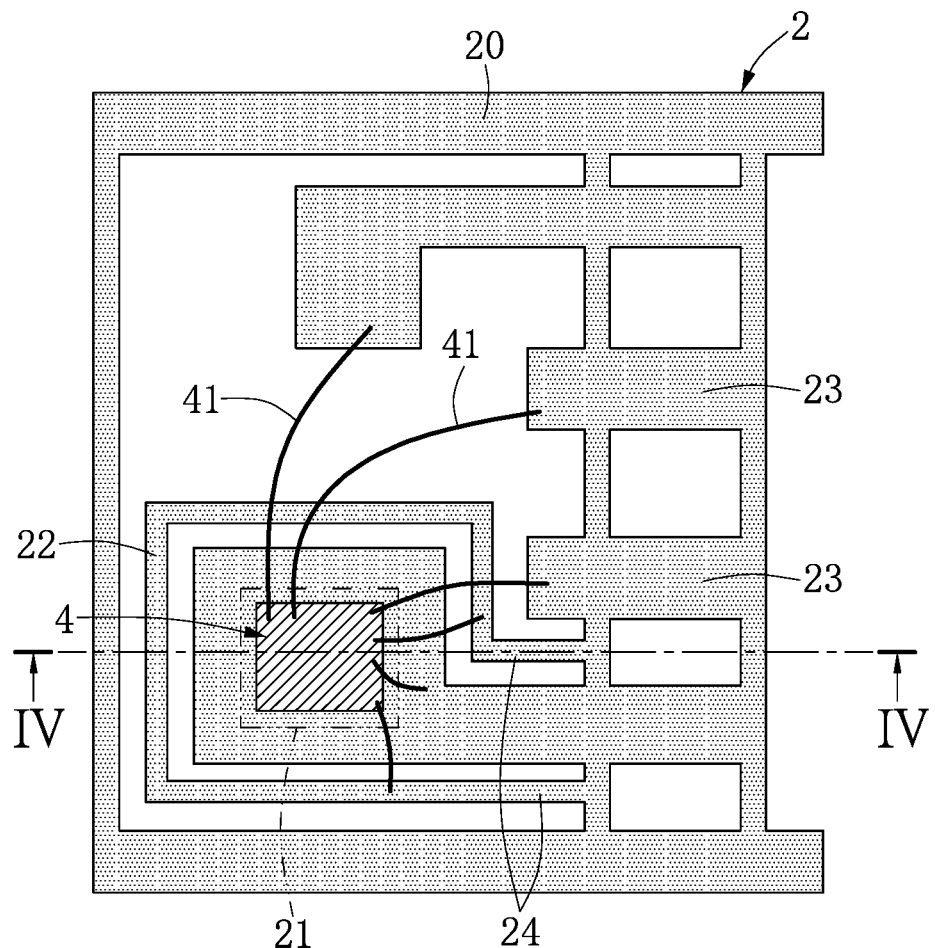
FIG. 3 is a top schematic view of a second leadframe used in an embodiment of the instant disclosure.
Figure 4:
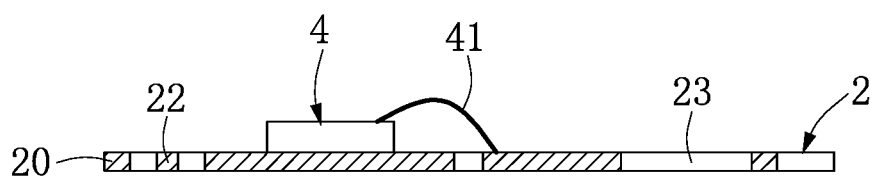
FIG. 4 is a sectional schematic view taken along line IV-IV of FIG. 3.

Reference is made to FIG. 1 to FIG. 4. FIG. 1 and FIG. 3 are top schematic views of first and second leadframes used in an embodiment of the instant disclosure, and FIG. 2 and FIG. 4 are sectional schematic views taken along the sectional lines in FIG. 1 and FIG. 3. The method provided by the instant disclosure can form a duo leadframe component by using two independent leadframe structures, i.e., a first leadframe 1 and a second leadframe 2. Next, taking the two independent leadframes shown in FIG. 1 and FIG. 2 as the main components, the magnetic coupling package structure provided by the embodiments of the instant disclosure is described herein.

Figure 5:
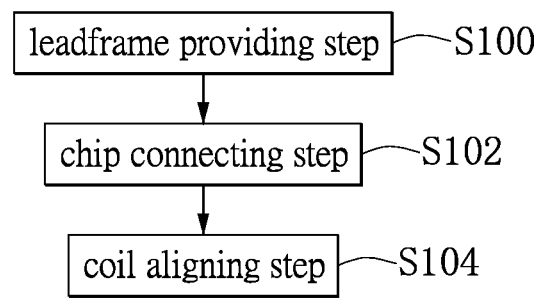
FIG. 5 is a flow chart of a method for manufacturing a magnetic coupling package structure of an embodiment of the instant disclosure.

Reference is made to FIG. 5. FIG. 5 is a flow chart of a method for manufacturing a magnetic coupling package structure of an embodiment of the instant disclosure. As shown in FIG. 5, the method provided by the instant disclosure includes a leadframe providing step (step S100), a chip connecting step (step S102) and a coil aligning step (step S104). Specifically, in the leadframe providing step, a first leadframe 1 and a second leadframe 2 that are separated from each other are provided.

As shown in FIG. 1, the first leadframe 1 includes a first chip-mounting portion 11, a first coil portion 12, a plurality of first pins 13 and a plurality of first floated pins 14. As shown in FIG. 3, the second leadframe 2 includes a second chip-mounting portion 21, a second coil portion 22, a plurality of second pins 23 and a plurality of second floated pins 24. By comparing FIG. 1 to FIG. 3, the first leadframe 1 and the second leadframe 2 have similar structures, i.e., both of which include a chip-mounting portion, a coil portion, a plurality of pins and a plurality of floated pins. However, the structures thereof are mirror images of each other.

In addition, the first leadframe 1 and the second leadframe 2 can further include a first frame body 10 and a second frame body 20 serving as supporting frames. As shown in FIG. 1 and FIG. 2, in an embodiment of the instant disclosure, the first chip-mounting portion 11 of the first leadframe 1 is surrounded by the first coil portion 12, and the first chip-mounting portion 11 and the first coil portion 12 are connected to the first frame body 10 through the first pins 13. Similarly, as shown in FIG. 3 and FIG. 4, the second chip-mounting portion 21 of the second leadframe 2 is surrounded by the second coil portion 22, and the second chip-mounting portion 21 and the second coil portion 22 are connected to the second frame body 20 through the second pin 23. In addition, the first floated pin 14 and the second floated pin 24 are used to respectively support the first coil portion 12 and the second coil portion 22.

It should be noted that the structural designs of the first leadframe 1 and the second leadframe 2 shown in FIG. 1 to FIG. 4 including the relative positioning between the chip-mounting portion and the coil portion are only shown in an embodiment of the instant disclosure. Different structural designs of the first leadframe 1 and the second leadframe 2 will be described later.

In other words, as long as the first coil portion 12 and the second coil portion 22 in the magnetic coupling package structure can transmit signals through inductive coupling, the relative positioning between the first chip-mounting portion 11 and the first coil portion 12, and between the second chip-mounting portion 21 and the second coil portion 22 are not limited in the instant disclosure.

However, the structural designs of the first leadframe 1 and the second leadframe 2 as shown in FIG. 1 to FIG. 4 can effectively reduce the size of the magnetic coupling package structure, thereby strengthening the coupling effect. Therefore, preferably, the first coil portion 12 surrounds the first chip-mounting portion 11, and the second coil portion 22 surrounds the second chip-mounting portion 21. Such an arrangement can reduce the overall size of the leadframe component and thereby increase electrical isolation and magnetic coupling efficiency.

The first leadframe 1 and the second leadframe 2 can be made of conductive material such as metal materials. The first leadframe 1 and the second leadframe 2 can be made of a same material or different materials. The first frame body 10, the first chip-mounting portion 11, the first coil portion 12 and the first pin 13 of the first leadframe 1 can be made of a same material and be formed as one piece. Similarly, the second frame body 20, the second chip-mounting portion 21, the second coil portion 22 and the second pin 23 can be made of a same material and be formed as one piece.

The first coil portion 12 and the second coil portion 22 can be formed by a metal frame or a metal ring including the strip-like metal elements of the first leadframe 1 and the second leadframe 2. The first coil portion 12 and the second coil portion 22 can be single loop coils or be multiple loop coils. In addition, in the instant disclosure, the number of the first coil portion 12 and the second coil portion 22 are not limited. For example, the first leadframe 1 can include two first coil portions 12 arranged symmetrically, and the second leadframe 2 can include two second coil portions 22 arranged symmetrically. Specifically, the two first coil portions 12 can be arranged at two opposite sides of the first chip-mounting portion 11, and the two second coil portions 22 can be arranged at two opposite sides of the second chip-mounting portion 21, thereby forming two signal channels. However, in the following description, the first leadframe 1 and the second leadframe 2 each includes one first coil portion 12 and one second coil portion 22.

Next, reference is made to FIG. 5. Step S102 is a chip connecting step including disposing at least a first chip and at least a second chip on the first chip-mounting portion 11 and the first coil portion 12 respectively and establishing electrical connections between the first chip and the first pins 13, and between the second chip and the second pins 23.

As shown in FIG. 1 and FIG. 3, in addition to the two leadframe structures (the first leadframe 1 and the second leadframe 2), FIG. 1 and FIG. 3 also illustrate the first chip 3 disposed on the first chip-mounting portion 11, the second chip 4 disposed on the second chip-mounting portion 21, and the plurality of first connecting wires 31 and the plurality of second connecting wires 32 electrically connected to the first chip 3 and the second chip 4, respectively. The first chip 3 and the second chip 4 are illustrated in FIG. 2 and FIG. 4. However, in order to keep the figures concise, only one of the plurality of first connecting wires 31 and one of the plurality of second connecting wires 41 are illustrated in FIG. 2 and FIG. 4.

As shown in FIG. 1 and FIG. 3, the first chip-mounting portion 11 and the first coil portion 12 are electrically connected to each other through the first connecting wire 31, and the second chip-mounting portion 21 and the second coil portion 22 are electrically connected to each other through the second connecting wire 41. In addition, the first chip-mounting portion 11 and the second chip-mounting portion 21 can be electrically connected to the first pin 13 and the second pin 23 through the first connecting wire 31 and the second connecting wire 41. The arrangement of other first and second connecting wires which are not numbered can be designed according to common knowledge in the art.

In the instant disclosure, the number of the plurality of first pins 13 and the plurality of second pins 23 can be designed and adjusted based on particular implementation, and are not limited in the instant disclosure. In addition, the implementation of the plurality of first connecting wires 31 and the plurality of second connecting wires 32 are not limited in the instant disclosure and can be designed according to common knowledge in the art.

For example, the first chip 3 and the second chip 4 can both be an integrated chip. In one of the embodiments of the instant disclosure, the first chip 3 includes a coil driving circuit unit, and the second chip 4 includes a receiving circuit unit. The high frequency signal is transmitted to the first coil portion 12 through the electrical connection between the coil driving circuit unit and the first coil portion 12, and the second coil portion 22 receives a high frequency voltage through the electrical connection between the receiving circuit unit and the second coil portion 22. Alternatively, in another embodiment, the first chip 3 can include a circuit unit, and the second chip 4 can include a coil driving circuit unit.

The arrangement of the first chip 3 and the second chip 4 in step S102 is not limited in the instant disclosure. In addition, in step S102, the first connecting wires 31 and the second connecting wires 41 can be disposed concurrently with the first chip 3 and the second chip 4. For example, the first connecting wires 31 can be connected between the first chip 3, the first chip-mounting portion 11 and the first pin 13 through wire-bonding, and the second connecting wires 41 can be connected between the second chip 4, the second chip-mounting portion 21, the second coil portion 22 and the second pin 23 through wire bonding.

Therefore, the input signal input from the coil driving circuit unit can be transmitted to an output end (the receiving circuit unit) by the effective magnetic coupling achieved by the alignment between the first coil portion 12 and the second coil portion 22 in the horizontal direction. Specifically, the first coil portion 12 of the first leadframe 1 and the first chip 3 together form a first closed circuit through the first connecting wire 31. By inputting a current into the first closed circuit, a high frequency alternating magnetic field can be generated. The high frequency alternating magnetic field generates a high frequency alternating current in a second closed circuit formed by the second coil portion 22 of the second leadframe 2, the second chip 4 and the second connecting wire 41. Therefore, the electrical signal can be transmitted from the second chip-mounting portion 21 (such as a transmitter) to the second chip 4 (such as a receiver) galvanically isolated from the first chip 3.

Figure 6:
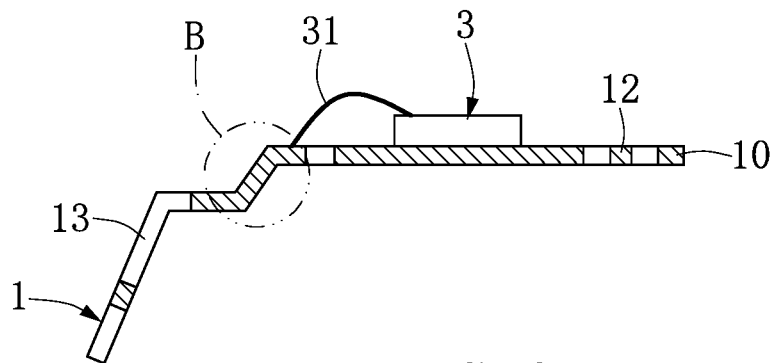
FIG. 6 is a sectional schematic view of the first leadframe shown in FIG. 2 after a pin portion is bent.
Figure 7:
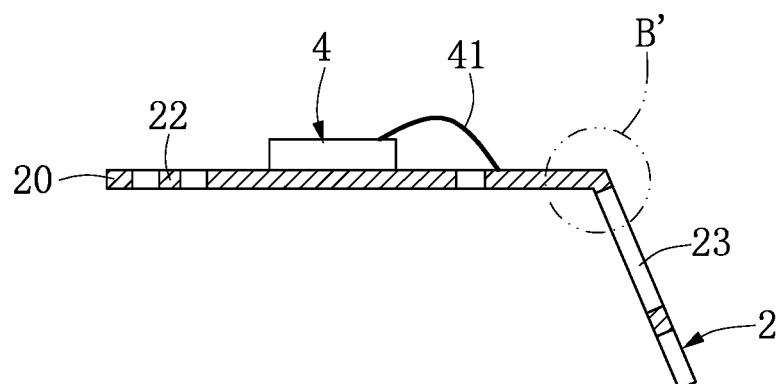
FIG. 7 is a sectional schematic view of the second leadframe shown in FIG. 4 after a pin portion is bent.

After step S102 is completed, the method provided by the instant disclosure can further include a step for forming bending portions in the first leadframe 1 and the second leadframe 2. Reference is made to FIG. 2, FIG. 4, FIG. 6 and FIG. 7. FIG. 6 is a sectional schematic view of the first leadframe 1 shown in FIG. 2 after the pins are bent, and FIG. 7 is a sectional schematic view of the second leadframe 2 shown in FIG. 4 after the pins are bent.

It should be noted that in the method provided by the instant disclosure, step S102 and the step for forming the bending portions are not necessarily performed by the order described above. In other words, before the step shown in FIG. 5, i.e., the coil aligning step, the bending portions can be formed after the first chip 3 and the second chip 4 are disposed, or the bending portions can be formed before disposing the first chip 3 and the second chip 4 on the first chip-mounting portion 11 and the second chip-mounting portion 21 respectively. In the following description, the bending portions are formed after step S102.

In the instant disclosure, the bending portions B, B' can be formed in the first leadframe 1 or in the second leadframe 2. Alternatively, the bending portions B, B' can be formed in both the first leadframe 1 and the second leadframe 2. In other words, the method provided by the instant disclosure can include forming at least a bending portion on at least one of the first leadframe 1 and the second leadframe 2.

In the embodiment shown in FIG. 6 and FIG. 7, the first leadframe 1 has a bending portion B formed therein, and the second leadframe 2 has a bending portion B' formed therein. The bending portion B can be formed between the first pin 13 and the first coil portion 12 and between the first pin 13 and the first chip-mounting portion 11. The bending portion B' can be formed between the second pin 23 and the second coil portion 22, and between the second pin 23 and the first coil portion 12.

Specifically, the formation of the bending portions B, B' can prevent the first coil portion 12 and the second coil portion 22 from contacting with each other during the subsequent steps, and prevent the first chip 3 disposed on the first chip-mounting portion 11 and the second chip 4 disposed on the second chip-mounting portion 21 from contacting with each other. Therefore, as long as the component in the first leadframe 1 and the components in the second leadframe 2 are prevented from contacting with each other, i.e., the first leadframe 1 and the second leadframe 2 are electrically insulated from each other, the size, number and direction of the bending of the bending portions B, B' can be adjusted. Specifically, the specific parameters of the bending portions B, B' can be designed based on the procedures of the manufacturing method and the inductive coupling and electrical insulating property of the product. The bending direction of the bending portions B, B' can be determined based on the position of the first chip 3 and the second chip 4; for example, the bending direction may differ when the chips are disposed on surfaces opposite to each other or surfaces facing each other.

Based on the formation of the bending portions B, B', the subsequent coil aligning step can be easily performed. In addition, by controlling the bending direction and the bending amount (the length or height of the bending portions B, B'), a height difference d (shown in FIG. 9) can be formed between the first chip-mounting portion 11 and the second chip-mounting portion 21 of the magnetic coupling package structure formed after the coil aligning step. The height difference d can be designed based on the inductive coupling and electrical insulating property of the product. In other words, by adjusting the value of the height difference d, the isolating voltage between the two leadframes and the magnetic coupling (inductive coupling) strength between the two coil portions can be adjusted.

For example, in the instant disclosure, the height difference d can be from 100 to 500 micrometers. In other words, in the product (the magnetic coupling package structure), the distance between the first coil portion 12 and the second coil portion 22 is preferably from 100 to 500 micrometers. By setting the height difference d to be between 100 and 500 micrometers, the isolating voltage and magnetic coupling efficiency between the first coil portion 12 and the second coil portion 22 can be ensured, and the size of the product can be effectively reduced.

Reference is made to FIG. 5. In step S104 (the coil aligning step), the first leadframe 1 is disposed at a position above or under the second leadframe 2, and a first magnetic field and a second magnetic field are respectively applied to the first leadframe 1 and the second leadframe 2 for aligning the first coil portion 12 and the second coil portion 22.

Specifically, step S104 includes arranging the first coil portion 12 of the first leadframe 1 and the second coil portion 22 of the second leadframe 2 one above another and aligning the first coil portion 12 of the first leadframe 1 and the second coil portion 22 of the second leadframe 2 with each other. Therefore, when the first coil portion 12 is driven by the first chip 3, or when the second coil portion 22 is driven by the second chip 4, the first coil portion 12 and the second coil portion 22 can match with each other and generate magnetic coupling.

Figure 8:
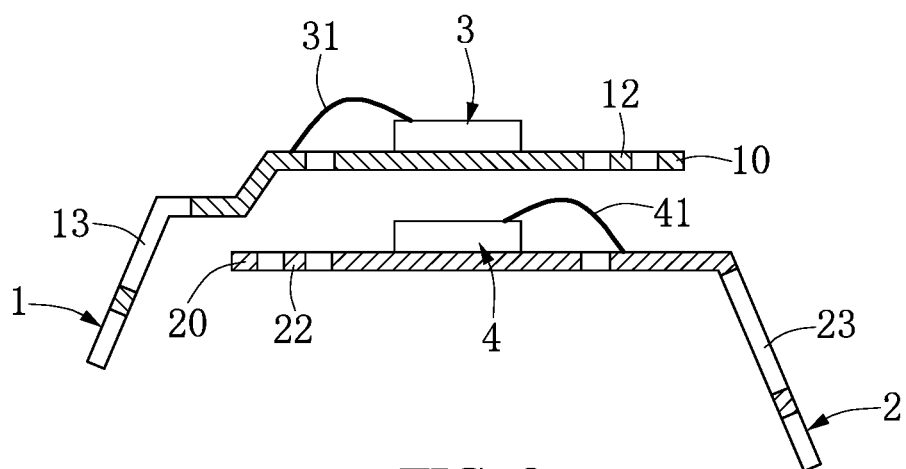
FIG. 8 is a schematic view of a state after the aligning step of the method for manufacturing the magnetic coupling package structure of an embodiment of the instant disclosure.

FIG. 8 is a schematic view of a state after the aligning step of the method for manufacturing the magnetic coupling package structure of an embodiment of the instant disclosure. In step S104, the first leadframe 1 is first disposed at a location above or under the second leadframe 2. The embodiment shown in FIG. 8 includes disposing the first leadframe 1 at a location above the second leadframe 2. Therefore, the first coil portion 12 of the first leadframe 1 and the second coil portion 22 of the second leadframe 2 are roughly aligned and corresponded to each other.

Next, two magnetic fields having opposite directions are respectively applied to the first coil portion 12 of the first leadframe 1 and the second coil portion 22 of the second leadframe 2. Therefore, the first coil portion 12 and the second coil portion 22 are subjected to magnetic forces and are aligned with each other, and the first coil portion 12 of the first leadframe 1 and the second coil portion 22 of the second leadframe 2 are arranged one above another and corresponding to each other. In other words, after step S104 is completed, the first coil portion 12 is arranged directly above the second coil portion 22 and is parallel to the second coil portion 22 as shown in FIG. 8. In addition, the first coil portion 12 and the second coil portion 22 are aligned with each other, thereby ensuring the coupling effect between the first coil portion 12 and the second coil portion 22. In addition, the first coil portion 12 and the second coil portion 12 have a nonconductive spacing (have a distance equal to the value of the height difference d) therebetween.

Therefore, based on the manner above, the method provided by the instant disclosure can achieve the effect of aligning the first coil portion 12 and the second coil portion 22 by a simple step.

Figure 9:
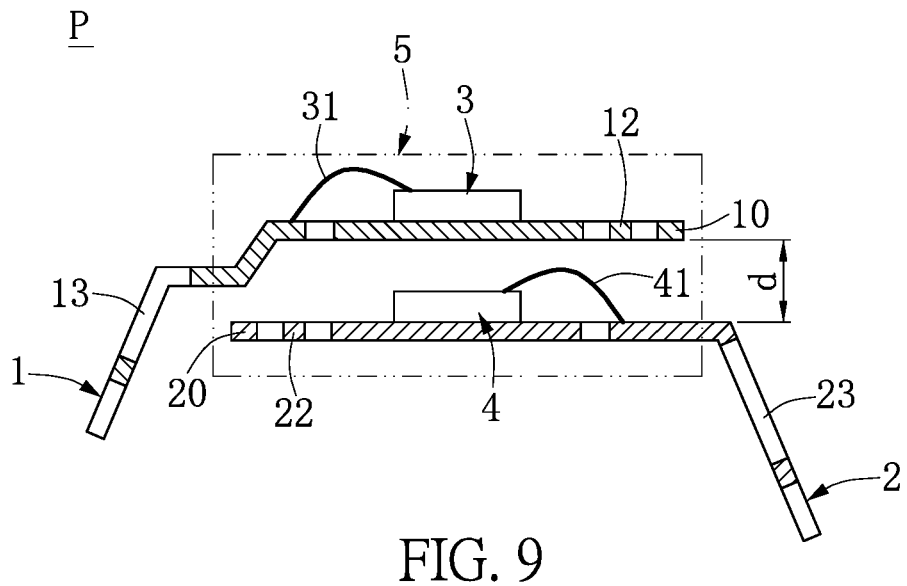
FIG. 9 is a schematic view of the magnetic coupling package structure of an embodiment of the instant disclosure.

The method for manufacturing a magnetic coupling package structure can further include a packaging step. Reference is made to FIG. 9, which is a schematic view of the magnetic coupling package structure of an embodiment of the instant disclosure.

The packaging step includes forming an insulating package body 5 for packaging the first chip 3 and the second chip 4, and connecting the first leadframe 1 to the second leadframe 2. After the packaging step, a portion of each of the first pins 13 is exposed from the package structure 5, and a portion of each of the second pins 23 is exposed from the package structure 5.

Specifically, after aligning the first coil portion 12 with the second coil portion 22, a package structure 5 can be formed to enclose the first chip-mounting portion 11 and the first coil portion 12 of the first leadframe 1, the second chip-mounting portion 21 and the second coil portion 22 of the second leadframe 2, and the first chip 3 and the second chip 4 respectively disposed on the first chip-mounting portion 11 and the second chip-mounting portion 21. A portion of the package structure 5 is filled between the first leadframe 1 and the second leadframe 2 for insulating the first coil portion 12 and the second coil portion 22 from each other.

In addition, a portion of each of the first pins 13 is exposed from the package structure 5, and a portion of each of the second pins 23 is exposed from the package structure 5. The portion of the first pin 13 and the portion of the second pin 23 exposed from the package structure 5 can be electrically connected to other electronic devices. For example, a portion of the first pin 13 and a portion of the second pin 23 can be used to provide the isolating voltage for the magnetic coupling package structure.

Finally, the method for manufacturing a magnetic coupling package structure can further include a step for removing the frame body. Specifically, the first frame body 10 and the second frame body 20 can be used to support the first leadframe 1 and the second leadframe 2 during the manufacturing steps. After the first leadframe 1 and the second leadframe 2 are connected through the package structure 5, the first frame body 10 and the second frame body 20 can be subject to a trim and form process to be removed. The manner for removing the first frame body 10 and the second frame body 20 is not limited in the instant disclosure.

It should be noted that in the instant disclosure, a polyimide material such a polyimide film can be disposed between the first leadframe 1 and the second leadframe 2 for increasing the isolating voltage before forming the package structure 5. In other words, the polyimide film can enhance the electrical isolation between the first leadframe 1 and the second leadframe 2. In addition, by using the polyimide film, the height difference (the distance of the spacing) between the first coil portion 12 and the second coil portion 22 can be effectively reduced by from 100 to 200 micrometers. Therefore, the magnetic coupling efficiency can be increased while ensuring the desired isolation voltage.

Figure 10:
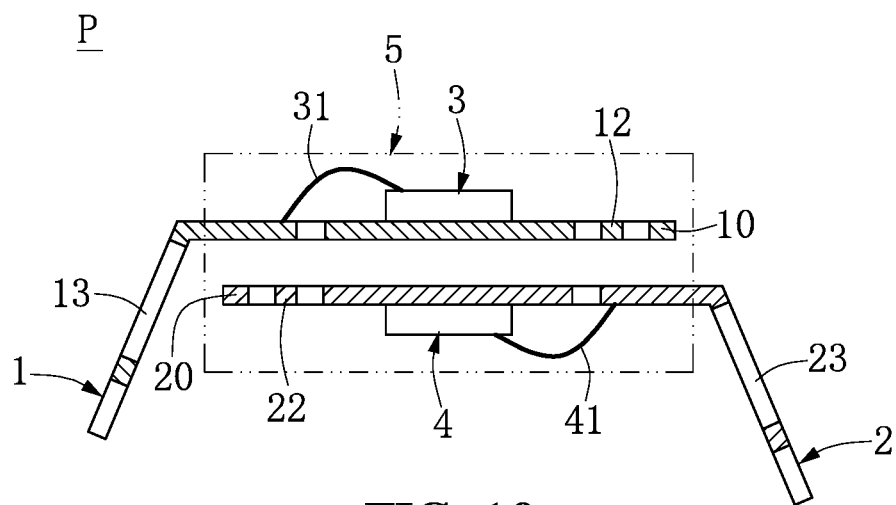
FIG. 10 is a schematic view of the magnetic coupling package structure of another embodiment of the instant disclosure.

Next, reference is made to FIG. 10. FIG. 10 is a schematic view of the magnetic coupling package structure of another embodiment of the instant disclosure. Compared to the embodiment shown in FIG. 9, the arrangement of the first chip 3 and the second chip 4 in the embodiment shown in FIG. 10 is different. Specifically, the first chip 3 and the second chip 4 shown in FIG. 10 are disposed on two chip-mounting portions that are opposite to each other (i.e., back-to-back). The first chip 3 and the second chip 4 shown in FIG. 9 are respectively disposed on two surfaces that face towards a same direction. However, the arrangement of the first chip 3 and the second chip 4 is not limited in the instant disclosure.

Figure 11:
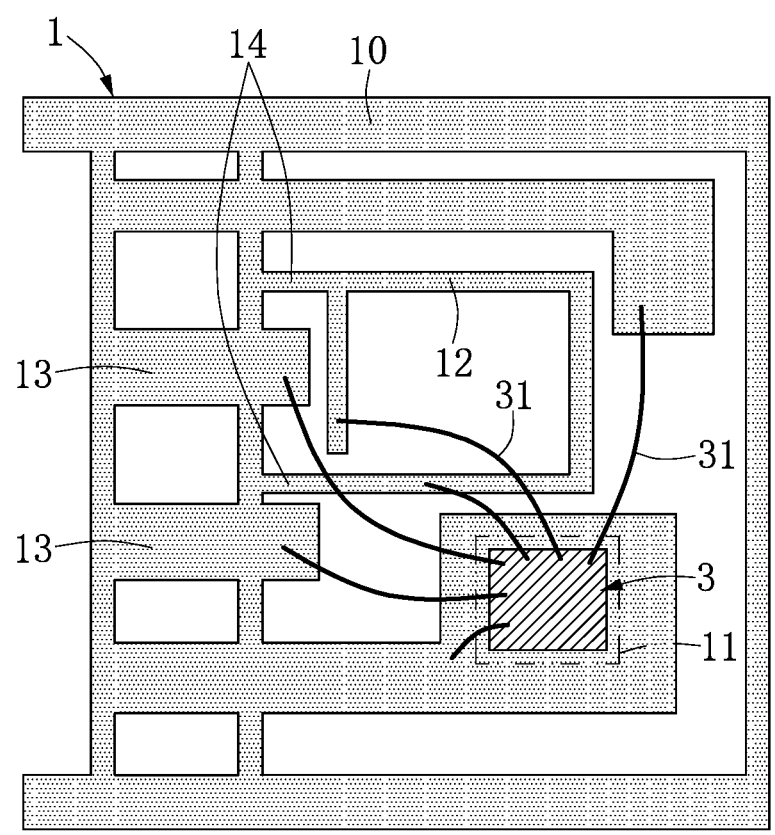
FIG. 11 is a top schematic view of a first leadframe used in another embodiment.
Figure 12:
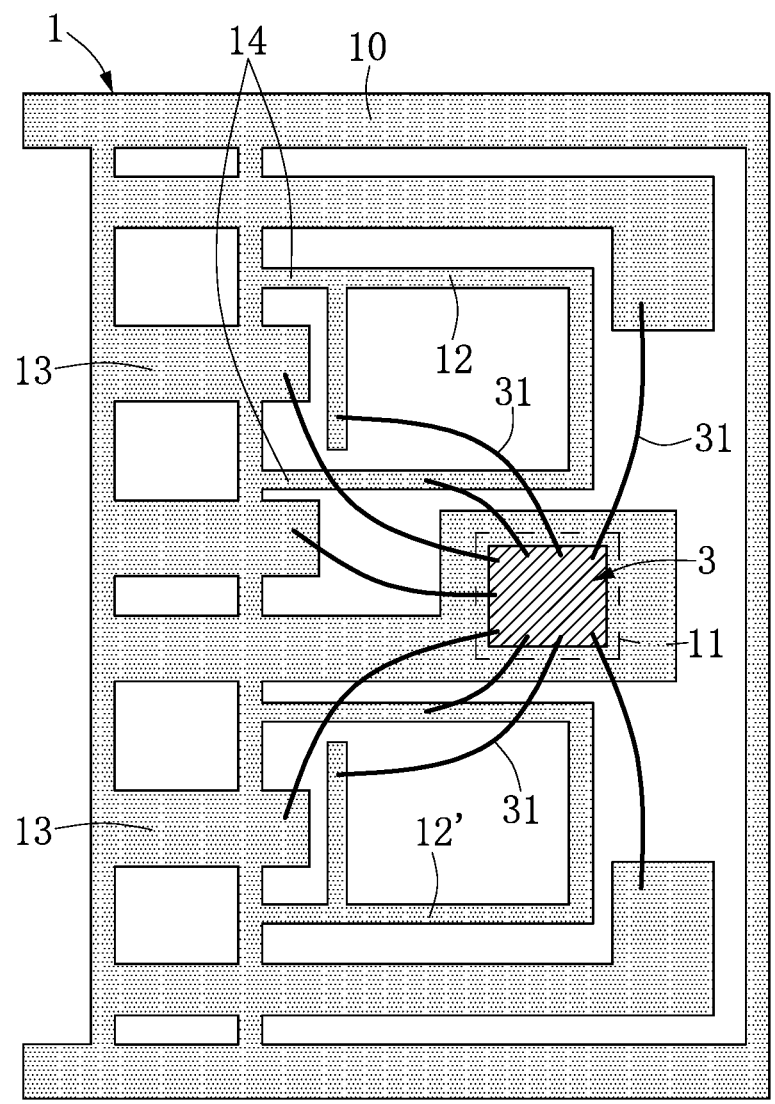
FIG. 12 is a top schematic view of a first leadframe used in yet another embodiment.

The components (elements) in the first leadframe 1 and the second leadframe 2 can be arranged in various manners. Reference is made to FIG. 11 and FIG. 12. FIG. 11 and FIG. 12 are top schematic views of the first leadframe used in different embodiments. Since the first leadframe 1 and the second leadframe 2 can have similar structures in a same embodiment, FIG. 11 and FIG. 12 only illustrate the structure of the first leadframe 1.

As shown in FIG. 11, the first chip-mounting portion 11 and the first coil portion 12 in the first leadframe 1 are separated from each other and adjacent to each other. In addition, in the instant disclosure, the numbers of the first coil portion 12 and the second coil portion 22 are not limited thereto. In the embodiment shown in FIG. 12, the first leadframe 1 includes two first coil portions 12, 12', and the two first coil portions 12, 12' and the first chip-mounting portion 11 are separated from each other and adjacent to each other. Specifically, as shown in FIG. 12, the two first coil portions 12, 12' are respectively disposed on two different sides of the first chip-mounting portion 11 and are supported by the first pin 13. Therefore, the first coil portions 12, 12' can be driven by the first chip 3 on the first chip-mounting portion 11 through different first connecting wires 31.

Therefore, the second leadframe 2 corresponding to the first leadframe 1 includes two second coil portions which are aligned with the first coil portions 12, 12' in the duo-leadframe magnetic coupling package structure P. The duo-leadframe magnetic coupling package structure P can be a double-channel device based on the above structural design and the design of the first chip 3 and the second chip 4.

Figure 13:
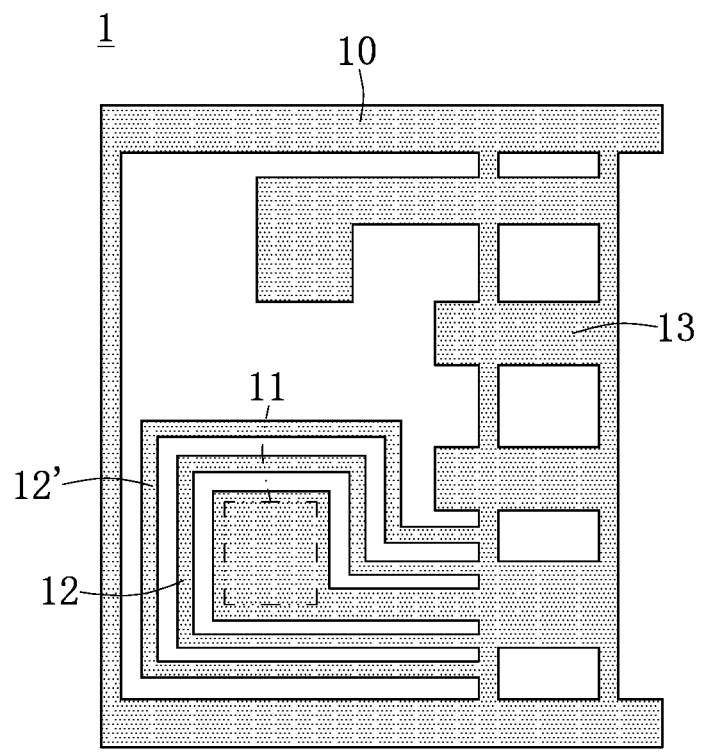
FIG. 13 is a top schematic view of a first leadframe used in yet another embodiment.
Figure 14:
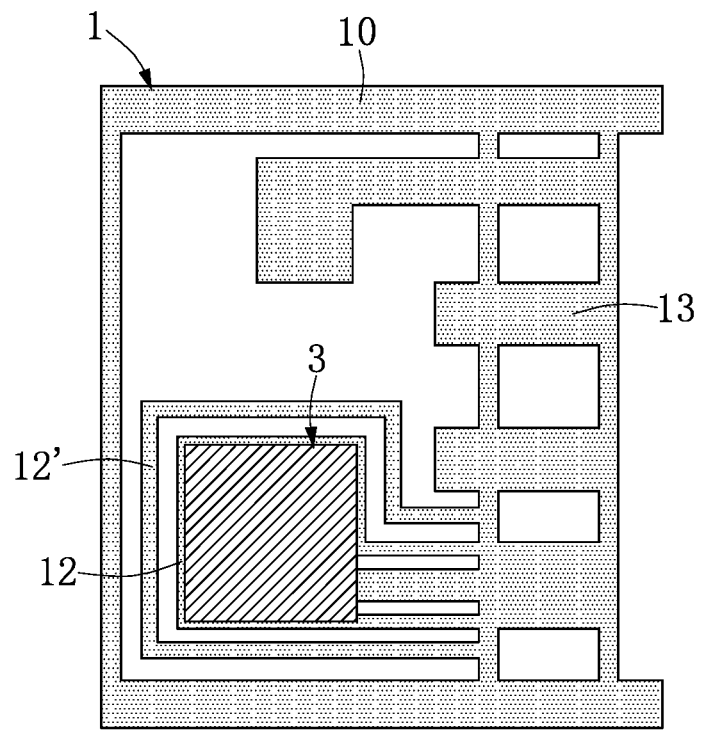
FIG. 14 is the top schematic view of the structure shown in FIG. 13 after the chips are disposed.

Next, reference is made to FIG. 13 and FIG. 14. FIG. 13 and FIG. 14 are top schematic views of a first leadframe used in an embodiment before and after the chip mounting step. When the first leadframe 1 includes two or more first coil portions 12, in addition to the structural design shown in FIG. 12, a design wherein "the first coil portion 12 surrounds the first chip-mounting portion 11" can be adopted.

As shown in FIG. 13, the first leadframe 1 includes two first coil portions 12, 12', and the two first coil portions 12, 12' surround the first chip-mounting portion 11. Specifically, the first coil portion 12 surrounds the first chip-mounting portion 11, and the first coil portion 12' surrounds the first coil portion 12. Therefore, a double-channel device can be formed without increasing the overall size of the duo-leadframe magnetic coupling package structure P.

As shown in FIG. 13, when performing a chip-connecting step on the first leadframe 1, the first chip 3 can be disposed on the first chip-mounting portion 11 for enabling the first chip 3 to cover a portion of the first coil portion 12. In other words, in this embodiment, the first coil portion 12 and the second coil portion 22 can be supported by at least a portion of the chip-mounting portion, thereby reducing the overall size of the product. Therefore, the arrangement of the first coil portions 12, 12' is not limited by the size of the first chip 3, thereby reducing the overall size of the duo-leadframe magnetic coupling package structure P and ensuring the magnetic coupling effect of the double-channel device (the duo-leadframe magnetic coupling package structure P).

The instant disclosure further provides a magnetic coupling package structure. The detailed structure of the duo-leadframe magnetic coupling package structure P is shown in FIG. 9 and FIG. 10. The duo-leadframe magnetic coupling package structure P provided by the instant disclosure can be formed by the method described above. Therefore, the details of the duo-leadframe magnetic coupling package structure P and the method for manufacturing the same are not reiterated herein.

Effects of the Embodiment

An advantage of the instant disclosure is that the magnetic coupling package structure P and the method for manufacturing the same provided by the instant disclosure can achieve the effects of increasing the aligning accuracy of the first coil portion 12 and the second coil portion 22 and the magnetic coupling effect of the first coil portion 12 and the second coil portion 22 can be controlled by the technical features of "disposing the first leadframe 1 at a position above or under the second leadframe 2 and respectively applying a first magnetic field and a second magnetic field to the first leadframe 1 and the second leadframe 2 for aligning the first coil portion 12 and the second coil portion 22" or "the first leadframe 1 is disposed at a location above or under the second leadframe 2, the first leadframe 1 and the second leadframe 2 have a height difference d therebetween, the first leadframe 1 and the second leadframe 2 are galvanically isolated from each other, and the first coil portion 12 and the second coil portion 22 match with each other for generating magnetic coupling".

Specifically, the duo-leadframe magnetic coupling package structure P provided by the instant disclosure is suitable for a semiconductor package element such as a microtransformer, and can achieve the effect of automatic alignment of the coil portions of the two independent leadframe structures (the first leadframe 1 and the second leadframe 2) by a simple manufacturing method in combination with specific structural design. In addition, based on the use of the package structure 5, the first coil portion 12 and the second coil portion 22 are highly insulated from each other. The duo-leadframe magnetic coupling package structure P provided by the instant disclosure can have an insulating voltage of more than 5 kV.

In addition, in the instant disclosure, the first coil portion 12 and the second coil portion 22 are aligned with each other and form effective magnetic coupling, thereby enabling a signal input from the input end (e.g., a reflector) to be transmitted to the output end (e.g., a receiver) through the coupling of the coils. Furthermore, the vertical distance between the first coil portion 12 and the second coil portion 22 can be controlled based on the design of the leadframe structure. For example, by adjusting the spacing distance between the second leadframe 2 including the second coil portion 22 and the first leadframe 1 including the first coil portion 12, the electrical insulating efficiency between the two coils can be adjusted.

The above-mentioned descriptions represent merely the exemplary embodiment of the present disclosure, without any intention to limit the scope of the instant disclosure thereto. Various equivalent changes, alterations or modifications based on the claims of the instant disclosure are all consequently viewed as being embraced by the scope of the instant disclosure.

What is claimed is:

1. A method for manufacturing a magnetic coupling package structure with duo leadframes for a magnetically coupled isolator, comprising:
   a leadframe providing step including providing a first leadframe and a second leadframe, wherein the first leadframe includes a first chip-mounting portion, at least a first coil portion, a plurality of first pins and a plurality of floated pins, and the second leadframe includes a second chip-mounting portion, at least a second coil portion, a plurality of second pins and a plurality of second floated pins;
   a chip connecting step including respectively disposing at least a first chip and at least a second chip on the first chip-mounting portion and the second chip-mounting portion and establishing electrical connections between the first chip and the first pins and between the second chip and the second pins; and
   a coil aligning step including disposing the first leadframe at a position above or under the second leadframe and respectively applying a first magnetic field and a second magnetic field to the first leadframe and the second leadframe for aligning the first coil portion and the second coil portion;
   wherein the first chip and the first coil portion together form a first closed circuit through a first connecting wire, and the at least one second chip and the at least one second coil portion together form a second closed circuit through a second connecting wire.

2. The method according to claim 1, further comprising, after the coil aligning step: forming an insulating package body for packaging the first chip and the second chip and connecting the first leadframe to the second leadframe, wherein a portion of each of the first pins is exposed from the insulating package body, and a portion of each of the second pins is exposed from the insulating package body, and the first chip-mounting portion and the second chip-mounting portion can be electrically connected to the first pins and the second pins through the first connecting wire and the second connecting wire.

3. The method according to claim 1, wherein the first magnetic field and the second magnetic field have different directions.

4. The method according to claim 1, wherein the first leadframe includes two first coil portions, the second leadframe includes two second coil portions, and the two first coil portions are aligned with the two second coil portions.

5. The method according to claim 1, wherein in the leadframe providing step, the first leadframe and the second leadframe are separated from each other.

6. A magnetic coupling package structure with duo leadframes for a magnetically coupled isolator, comprising:
   a first leadframe including a first chip-mounting portion, at least a first coil portion, a plurality of first pins and a plurality of first floated pins;
   a second leadframe including a second chip-mounting portion, at least a second coil portion, a plurality of second pins and a plurality of second floated pins;
   a first chip disposed on the first chip-mounting portion;
   a second chip disposed on the second chip-mounting portion; and
   an insulating packaging body packaging the first chip and the second chip and connecting the first leadframe to the second leadframe, wherein a portion of each of the first pins is exposed from the insulating package body, and a portion of each of the second pins is exposed from the insulating package body, the portion of each of the first pins and the portion of the second pins are configured to respectively provide an isolating voltage to the first leadframe and the second leadframe;

wherein the first leadframe is disposed at a location above or under the second leadframe, the first leadframe and the second leadframe having a height difference therebetween, the first leadframe and the second leadframe being galvanically isolated from each other, and the first coil portion and the second coil portion match with each other for generating magnetic coupling;

wherein the first chip and the first coil portion together form a first closed circuit through a first connecting wire, and the at least one second chip and the at least one second coil portion together form a second closed circuit through a second connecting wire.

7. The magnetic coupling package structure according to claim 6, wherein the first chip includes a coil driving circuit unit, the second chip includes a receiving circuit unit.

8. The magnetic coupling package structure according to claim 7, wherein a high frequency signal is transmitted to the first coil portion by an electrical connection between the coil driving circuit unit and the first coil portion, and the second coil portion receives a high frequency voltage by an electrical connection between the receiving circuit unit and the second coil portion.

9. The magnetic coupling package structure according to claim 6, wherein the first chip and the second chip are disposed back to back.

10. The magnetic coupling package structure according to claim 6, wherein the height difference between the first coil portion and the second coil portion ranges from 100 to 500 micrometers, and a polyimide material is filled between the first coil portion and the second coil portion.

* * * * *